(12) United States Patent
Bandyopadhyay et al.

(10) Patent No.: US 10,141,845 B2
(45) Date of Patent: Nov. 27, 2018

(54) DC-DC CONVERTER AND CONTROL CIRCUIT WITH LOW-POWER CLOCKED COMPARATOR REFERENCED TO SWITCHING NODE FOR ZERO VOLTAGE SWITCHING

(71) Applicant: Texas Instruments Incorporated, Dallas, TX (US)

(72) Inventors: Saurav Bandyopadhyay, Dallas, TX (US); Robert A. Neidorff, Bedford, NH (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/366,264

(22) Filed: Dec. 1, 2016

(65) Prior Publication Data

US 2017/0302178 A1    Oct. 19, 2017

Related U.S. Application Data

(60) Provisional application No. 62/321,988, filed on Apr. 13, 2016.

(51) Int. Cl.
*H02M 1/42*   (2007.01)
*H02M 3/335*  (2006.01)
(Continued)

(52) U.S. Cl.
CPC .......... *H02M 3/158* (2013.01); *H03K 17/284* (2013.01); *H03K 2217/0063* (2013.01); *H03K 2217/0072* (2013.01)

(58) Field of Classification Search
CPC ................ H02M 3/158; H03K 17/284; H03K 2217/0063; H03K 2217/0072
(Continued)

(56) References Cited

U.S. PATENT DOCUMENTS 5,594,635 A    1/1997  Gegner
5,684,688 A    11/1997 Rouaud et al.
(Continued)

FOREIGN PATENT DOCUMENTS

CN    104201884    10/2014
JP    H07123707    12/1994

OTHER PUBLICATIONS

International Search Report from corresponding PCT Application No. PCT/US2016/069149, dated May 25, 2017 (2 pages).
(Continued)

*Primary Examiner* — Brandon S Cole
(74) *Attorney, Agent, or Firm* — Michael A. Davis, Jr.; Charles A. Brill; Frank D. Cimino

(57) ABSTRACT

Disclosed examples provide DC-DC converters and control circuits to provide high and low-side driver signals and to selectively adjust a delay time between a low-side switching device turning off and a high-side switching device turning on according to a comparator signal, including a clocked comparator circuit referenced to a switching node to sample the voltage across the high-side switching device in response to a first edge of the high-side driver signal, and to generate the comparator signal indicating a polarity of the sampled high-side switch voltage to facilitate zero voltage switching of the high-side switching device.

23 Claims, 7 Drawing Sheets

(51) Int. Cl.
*G05F 1/10* (2006.01)
*H02M 7/48* (2007.01)
*H02M 3/158* (2006.01)
*H03K 17/284* (2006.01)

(58) Field of Classification Search
USPC ..... 327/108–112, 379, 389, 391; 326/22–27, 326/81–87
See application file for complete search history.

(56) References Cited

U.S. PATENT DOCUMENTS

| | | | |
|---|---|---|---|
| 5,736,842 | A | 4/1998 | Jovanovic |
| 5,793,190 | A | 8/1998 | Sahlstrom et al. |
| 6,462,963 | B1 | 10/2002 | Wittenbreder |
| 7,145,316 | B1* | 12/2006 | Galinski, III ......... H02M 3/156 323/288 |
| 7,940,033 | B2 | 5/2011 | Dowlatabadi |
| 8,259,421 | B2 | 9/2012 | Nakahashi et al. |
| 9,172,299 | B2 | 10/2015 | Hamza et al. |
| 9,350,240 | B2* | 5/2016 | Dong ..................... H02M 1/36 |
| 9,673,706 | B2* | 6/2017 | Matsuki ................. H01L 23/00 |
| 2004/0136209 | A1 | 7/2004 | Hosokawa et al. |
| 2008/0068867 | A1* | 3/2008 | Yamada ................ H02M 3/155 363/21.01 |
| 2008/0278128 | A1* | 11/2008 | Nagase ................ H02M 3/158 323/282 |
| 2009/0027027 | A1 | 1/2009 | Lin et al. |
| 2009/0134855 | A1 | 5/2009 | Landwehr |
| 2009/0140706 | A1 | 6/2009 | Taufik et al. |
| 2009/0237042 | A1 | 9/2009 | Glovinski |
| 2010/0061122 | A1 | 3/2010 | Okubo et al. |
| 2010/0164593 | A1* | 7/2010 | Ha ................. H03K 19/018528 327/333 |
| 2010/0327834 | A1* | 12/2010 | Lowe, Jr. .................. G05F 1/56 323/282 |
| 2011/0149610 | A1 | 6/2011 | Moussaoui et al. |
| 2012/0099232 | A1* | 4/2012 | Kuroyabu ........... H01L 27/0266 361/56 |
| 2012/0218785 | A1 | 8/2012 | Li et al. |
| 2012/0274294 | A1* | 11/2012 | Lee ....................... H02M 3/156 323/282 |
| 2013/0093403 | A1 | 4/2013 | Jia et al. |
| 2013/0235631 | A1 | 9/2013 | Pahlevaninezhad et al. |
| 2013/0249520 | A1 | 9/2013 | Oikarinen et al. |
| 2014/0104952 | A1 | 4/2014 | Takeuchi et al. |
| 2014/0152271 | A1 | 6/2014 | Jeong et al. |
| 2014/0177300 | A1 | 6/2014 | Lagroce et al. |
| 2014/0232359 | A1 | 8/2014 | Dash et al. |
| 2014/0266130 | A1 | 9/2014 | Chiang et al. |
| 2015/0002115 | A1 | 1/2015 | Shenoy et al. |
| 2015/0022170 | A1 | 1/2015 | Chen |
| 2015/0162815 | A1 | 6/2015 | Mikami et al. |
| 2015/0326123 | A1 | 11/2015 | Fukushima et al. |
| 2016/0065071 | A1* | 3/2016 | Matsuki ................. H01L 23/00 323/268 |
| 2016/0365790 | A1 | 12/2016 | Ye et al. |
| 2017/0019093 | A1* | 1/2017 | Kanda .............. H03K 3/356113 |
| 2017/0063227 | A1* | 3/2017 | Nakamura ............ H02M 3/158 |
| 2017/0154739 | A1* | 6/2017 | Sugahara ................. H01H 9/54 |

OTHER PUBLICATIONS

International Search Report from corresponding PCT Application No. PCT/US2017/027452, dated Aug. 24, 2017 (2 pages).
Asad Abidi et al., "Understanding the Regenerative Comparator Circuit" Electrical Engineering Department, University of California, Los Angeles, 2014 IEEE, 8 pgs.
Behzad Razavi, "The StrongARM Latch", A Circuit for All Seasons, IEEE Solid-State Circuits Magazine, Spring 2015, pp. 12-17.
http://escholarship.org/us/item/6st6k2nz, 2.5.4 Comparator Design, pp. 27-28, 2013.
Jing Xue, Ho Lee, "A 2MHz 12-to-100V 90%-Efficiency Self-Balancing ZVS Three-Level DC-DC Regulator with Constant-Frequency AOT V2 Control and 5ns ZVS Turn-On Delay", ISSCC 2016 / Session 12 / Efficient Power Conversion / 12.5, 2016 IEEE International Solid-State Circuits Conference, Digest of Technical Papers, pp. 226-228.
Hua et al., "Novei Zero-Voltage-Transition PWM Converters", IEEE Transactions of Power Electronics, vol. 9, No. 2, Mar. 1994, pp. 213-219.

* cited by examiner

DC-DC CONVERTER AND CONTROL CIRCUIT WITH LOW-POWER CLOCKED COMPARATOR REFERENCED TO SWITCHING NODE FOR ZERO VOLTAGE SWITCHING

REFERENCE TO RELATED APPLICATION

Under 35 U.S.C. § 119, this application claims priority to, and the benefit of, U.S. provisional patent application Ser. No. 62/321,988, entitled "FLOATING CLOCKED COMPARATOR", and filed on Apr. 13, 2016, the entirety of which is hereby incorporated by reference.

BACKGROUND

Switching DC-DC converter circuits are used to convert input DC voltage to an output DC voltage or current to drive a load. Many DC-DC converter circuits use high and low-side switches, typically actuated in alternating fashion to convert the input voltage to an output voltage. Switching losses can occur when the voltage across the high-side switch is non-zero due to discharging of capacitance associated with the high-side switch. To achieve high efficiency, it is desirable to turn the high-side switch on when the voltage across the switch is at or close to zero. The high-side switch voltage can be measured for zero voltage switching (ZVS), but the high-side switch voltage can be very high. For example, the high-side switch can be connected to the power converter input rail and to the switching node that can resonate up to or beyond the power converter input rail voltage for resonant converters. As a result, measuring the voltage across the high-side switch to implement zero voltage switching requires high voltage comparators to accommodate high input voltages to the comparator, and high voltage comparators typically suffer from slow response time. In this regard, ZVS detecting comparators should be fast for use in real-time switching control (low propagation delay) since the comparison must be made during the short interval when the switching node is resonating toward the power converter input rail after the low-side device is turned off. Moreover, continuous time comparators have high power consumption for high speed operation. Another approach is to use voltage dividers that reduce the detected signal, but this approach may require large voltage divider components and size restraints typically require the voltage divider resistors to be external from a controller integrated circuit (IC). In addition, voltage divider resistors consume power in order to implement ZVS detection. Another approach provides near-ZVS detection using an auxiliary diode and current mirrors referenced to the switching node, but this approach requires additional circuitry and is costly in terms of size and power consumption.

SUMMARY

Disclosed examples include DC-DC converters and control circuits to provide high and low-side driver signals to control an output voltage. A comparator circuit compares the voltages across the high-side switching device, and is referenced to the switching node to allow use of low voltage components. The comparator circuit is clocked according to an edge of a signal that turns the high-side driver on to sample the voltage across the high-side switch and to generate a comparator signal indicating the polarity of the voltage across the high-side switch. The control circuit selectively adjusts a delay time between a low-side switching device turning off and a high-side switching device turning on according to the comparator signal to facilitate zero voltage switching. In certain examples, the comparator circuit includes a level shift circuit to receive the comparator signal from the clocked comparator and to provide a level shifted comparator signal to the control circuit.

DETAILED DESCRIPTION

Figure 1:
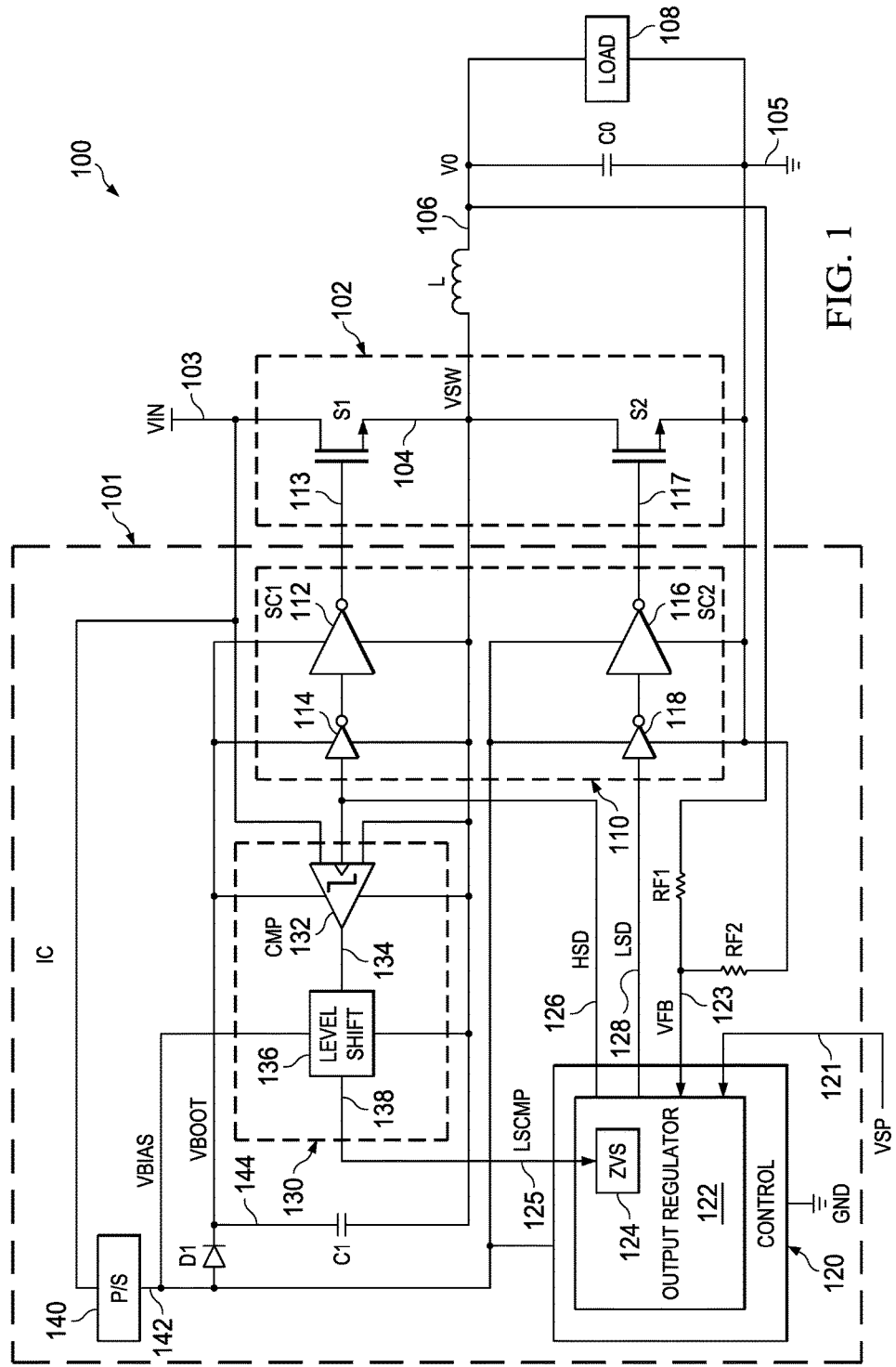
FIG. 1 is a schematic diagram of a DC-DC buck converter with a controller integrated circuit (IC) including a clocked comparator referenced to a switch node voltage to measure a voltage across a high-side switching device and a low power level shifter circuit to provide a level shifted comparator signal to a control circuit to implement zero voltage switching.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

FIG. 1 shows a switching DC-DC converter circuit 100 including first and second switching devices or switches S1 and S2 connected in a switch circuit 102 between an input voltage node 103 having an input voltage VIN and a ground or other reference voltage node 105 having a reference voltage GND. The upper or high-side first switching device S1 is coupled between the input voltage node 103 and a switching node 104, and the lower or low-side second switching device S2 is coupled between the switching node 104 and the reference voltage node 105. Alternate switching of the first and second switches S1 and S2 controls a switch node voltage VSW at the switching node 104 in order to selectively charge and discharge an output inductor L connected between the switching node 104 and an output node or terminal 106. Current flow from the inductor L drives a load 108 at a controlled output voltage VO, and an output capacitor CO is connected between the output node 106 and the reference voltage node 105 as shown. The DC-DC converter circuit 100 also includes driver circuitry 110 to provide switching control signals SC1 and SC2 to operate the switching circuit 102, as well as a control circuit 120 that provides high and low side driver signals HSD and LSD on lines 126 and 128 to the driver circuitry 110.

In order to facilitate zero voltage switching operation of the control circuit 120, the IC 101 also includes a comparator circuit 130 referenced to the switching node 104 as described further below. In addition, the IC 101 includes a power circuit or power source 140 that receives power from the input voltage node 103 and provides a first supply voltage VBIAS at a first supply voltage node 142 relative to the reference voltage GND of the reference voltage node 105. A diode D1 has an anode connected to the first supply voltage node 142 and a cathode connected to a second supply voltage node 144 in order to provide a second supply voltage VBOOT across a capacitor C1 connected between the node 144 and the switching node 104. In the illustrated example, the control circuit 120 is powered by the first supply voltage VBIAS, and is referenced to the reference node voltage GND. Charging current from the first supply node 142 flows through the diode D1 to charge the capacitor C1 when the low-side switch S2 is on. D1 is reverse biased to block current flowing out of the capacitor C1 when the charged capacitor voltage relative to the switching node voltage VSW exceeds the second supply voltage VBIAS. In this manner, the second supply voltage VBOOT provides a low voltage supply (e.g., 3-5 volts) relative to the floating switching node 104 to power the driver circuit 112, 114 at a level suitable to reliably turn the high-side switching device S1 on and off according to the high-side driver signal HSD. The second supply voltage VBOOT, moreover, is independent of the input voltage level VIN.

In one example, the switching circuit 102 is external to the controller IC 101. In other embodiments, the switches S1 and S2 can be internal to the controller IC 101. The IC 101 in the illustrated example provides internal driver circuitry 110 to provide a first switching control signal SC1 to the control terminal 113 of the first switching device S1, and a second switching control signal SC2 to a control terminal 117 of the second switching device S2. The driver circuitry 110 in other embodiments can be external to the controller IC 101. In the example of FIG. 1, the driver circuitry 110 includes a first driver circuit with an inverting primary driver 112 providing the signal SC1 to the first switch S1, and an inverter 114 that provides a control signal to the driver 112 according to a first driver signal HSD from a control circuit 120.

The driver circuits 112 and 114 control the gate control voltage of the high-side first switch S1 at a suitable level relative to the switching node voltage VSW at the node 104 to turn the switch S1 on or off. The driver circuits 112 and 114 are referenced to the switching node 104 and powered by the second supply voltage VBOOT to provide the control signal SC1 to drive the first switch S1. The driver 112 provides the signal SC1 according to the first driver signal HSD from the control circuit 120 at a high level relative to the switching node 104 (e.g., at or near VBOOT) to turn on the NMOS switching device S1. The driver circuit 112 provides SC1 at a low level (e.g., near the switching node voltage VSW) to turn off S1.

The second driver circuit includes a second inverting primary driver 116 that provides the second switching control signal SC2 according to an input signal from a second inverter 118. The control circuit 120 provides the second (low-side) driver signal LSD to cause the primary driver 116 to provide the SC2 signal at a high level relative to the reference node 105 (e.g., at or near VIN or VBIAS) to turn S2 on, and at a low level near GND to turn S2 off. The control circuit 120 can provide active high or active low driver signals HSD and LSD according to the inverting or non-inverting logic of the driver circuitry 110 and the type of driven switching device according to the particular switching devices S1 and S2 used. For example, the control circuit 120 can provide active high driver signals via the driver circuits 110 for turning on NMOS devices S1 and S2 as shown, or other implementations can provide active low driver signals for turning on PMOS devices, etc.). The switching devices S1 and S2 are NMOS transistors in the illustrated example. Other types of high and low-side switches can be used in other embodiments, such as PMOS transistors, NMOS transistors, bipolar transistors, etc. or combinations thereof.

The control circuit 120 can be any suitable circuitry that provides the first and second driver signals HSD and LSD to regulate or otherwise control the output voltage signal VO. In one example, the control circuit 120 includes an output regulator circuit 122 that provides closed loop output voltage regulation by generating the HSD and LSD signals on the output lines 126 and 128 to minimize a difference between a setpoint voltage signal VSP on an input line 121 and a feedback voltage signal VFB on an input line 123. In the example of FIG. 1, a resistive voltage divider circuit formed by resistors RF1 and RF2 provides the feedback signal VFB from the output voltage signal VO. Although illustrated in connection with a buck type DC-DC converter configuration of the high and low-side switching devices S1 and S2, other embodiments of the disclosed techniques can be used in any form of switching converter having high and low-side switching devices, including without limitation boost converters, buck-boost converters, Cuk converters, H-bridge converters, half-bridge converters, LLC converters, etc.

The control circuit 120 also includes a zero voltage switching (ZVS) circuit 124 with an input 125 that receives a level-shifted comparator signal LSCMP from an output 138 of the comparator circuit 130. In this example, the LSCMP signal is a Boolean voltage signal having first and second discernible states indicating the polarity of the voltage across the first switching device S1 when S1 is turned on in a given switching cycle of the switching circuit 102. Based on this comparator signal, the ZVS circuitry 124 selectively adjusts the delay time between S2 turning off and S1 turning on in a subsequent switching cycle. The adjustment or adaptation of the relative timing between these events can be direct or indirect. In one implementation, the ZVS circuit 124 decreases the delay for the next cycle when the signal LSCMP indicates the switching voltage is negative (VIN<VSW) in the present switching cycle, and increases decreases the delay for the next cycle when LSCMP indicates the switching voltage is positive (VIN>VSW). In certain embodiments, the clocked comparator circuit 132 compares the switch node voltage VSW to a threshold voltage VTH, for example, a voltage below the input voltage VIN, to determine whether VTH<VSW or VTH>VSW. The zero voltage switching control circuitry 124 in one example operates as an inner control loop by adjusting the turn on timing of S1 after turning off S2 to regulate the drain-source voltage of S1 at or near zero at turn on. In this example, the output regulation circuitry 122 operates as an outer control loop to regulate the output voltage VO.

Figure 2:
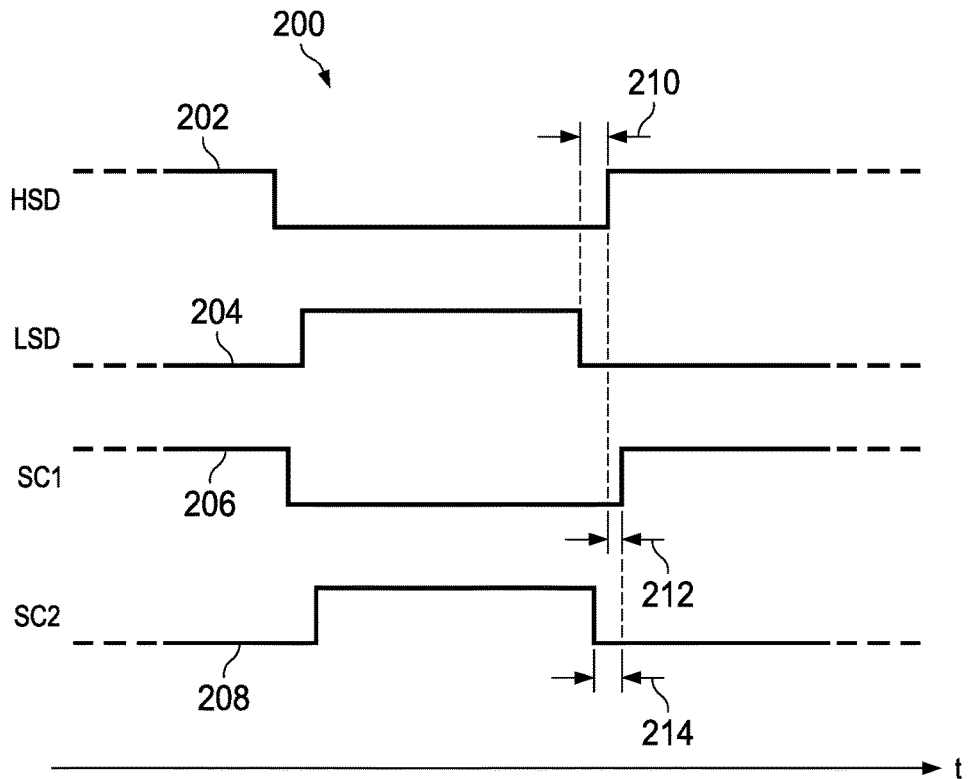
FIG. 2 is a waveform diagram showing driver output signals from the control circuit in FIG. 1 and switching control signals to operate high and low-side switches in the DC-DC converter.

FIG. 2 shows a waveform diagram 200 illustrating driver output signals HSD 202 and LSD 204 generated by the control circuit 120 in an illustrated portion of the switching cycle of the DC-DC converter 100. The waveform diagram 200 also shows corresponding switching control signals SC1 206 and SC2 208 to operate the high and low-side switches S1 and S2, respectively. A falling edge of the LSD signal waveform 204 causes the second driver circuitry 118, 116 to provide a slightly delayed falling edge in the second switching control signal SC2 to turn off S2. The control circuit 120 implements the zero voltage switching circuitry or component 124 according to the LSCMP signal to adjust (e.g., increase or decrease) a dead time 210 between the falling edge of the LSD signal waveform 204 and a subsequent rising edge of the HSD waveform 202. The rising edge of the high-side driver signal waveform 204 causes the first driver circuitry 112, 114 to provide a subsequent rising edge in the first switching control signal SC1 to turn on S1. As shown in the example of FIG. 2, the rising edges of the driver and switching control signal waveforms 202 and 206 are offset in time by a generally fixed delay time 212 based on the circuit response time of the inverter 114 and the output driver 112. A similar time lag exists between the low-side driver and switching control signal waveforms 204 and 208. In the case where the first and second driver circuits are substantially similar and have similar response times, the driver signal dead time 210 is approximately equal to a switching control signal dead time 214 between the falling edge of SC2 208 and the subsequent rising edge of SC1 206.

Figure 3:
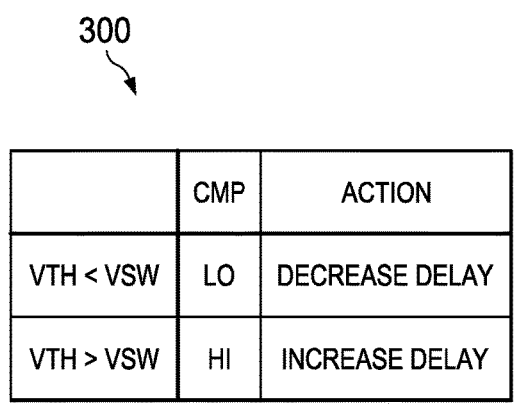
FIG. 3 is a table showing control circuit operation to implement zero voltage switching by selectively adjusting a delay time between turning the low-side switch off and turning the high-side switch on according to the comparator signal.

FIG. 3 illustrates a table 300 showing operation of these ZVS circuit 124 to implement zero voltage switching with respect to the high-side first switching device S1. In operation, the ZVS circuit 124 in this example identifies the polarity of the voltage difference between the switching node voltage VSW and the threshold voltage VTH. In some examples, the threshold voltage is the input voltage VIN, and the circuit 124 identifies the voltage VIN−VSW across the switch S1 at or near turn-on according to the polarity of the comparator signal CMP (or equivalently according to the polarity of the level shifted comparator signal LSCMP). From this, the ZVS circuit 124 determines whether the threshold voltage signal VTH is greater than or less than the switching node voltage signal VSW. In the illustrated example, when CMP (and thus LSCMP) is low, VTH<VSW at the time the comparator circuit sample the S1 drain-source voltage, and the circuit 124 decreases the delay 214 between the switching control signals SC1 and SC2 by changing the corresponding delay 210 between the high and low-side driver signals 202 and 204. Conversely, when CMP and LSCMP are high (sampled comparator inputs indicate that VTH>VSW), the ZVS circuit 124 increases the driver signal delay 210 in order to cause a corresponding increase in the switching control signal delay time 214. By selectively adjusting the delay time 214 between turning the low-side switch off and turning the high-side switch on according to the comparator signal CMP or LSCMP, the ZVS circuit 124 implements and inner closed loop that regulates the affective drain-source voltage of the high-side switch S1 at or near 0 V when S1 is turned on.

The comparator circuit 130 is referenced to the switching node 104 and is powered by the second supply voltage VBOOT. The IC 101 thus provides the capability to evaluate the high-side switch voltage during switching without the cost of high-voltage comparator circuitry and/or voltage divider circuits. Moreover, the comparator circuit 130 includes a clocked comparator circuit 132 that receives a clock input to initiate sampling of the input voltage VIN (or a threshold voltage VTH derived from VIN) and the switching node voltage VSW. In the illustrated example, the comparator circuit 130 samples the voltages VTH and VSW in response to a first edge of the first driver signal HSD. In other examples, different clock input signals can be provided to the clocked comparator circuit 132. The circuit 130 generates the comparator signal CMP at an output node 134. The comparator signal CMP has a first state LO indicating that the threshold voltage VTH is less than the switching node voltage VSW of the switching node 104, and a second state HI indicating that the threshold voltage VTH is greater than the switching node voltage VSW. The control circuit 120 selectively adjusts the delay time 214 between the second switching device S2 turning off and the first switching device S1 turning on according to the comparator signal CMP to facilitate zero voltage switching ZVS of the first switching device S1. In addition, the illustrated comparator circuitry 130 further includes a level shift circuit 136 to provide the level shifted comparator signal LSCMP an output 138 connected to the input 125 of the control circuit 120. Accordingly, the control circuit 120 receives the signal LSCMP reference to the reference voltage node 105 (GND) having first and second states indicating the polarity of the sample voltage across the first switching device S1 at or near turn on of S1.

Figure 4:
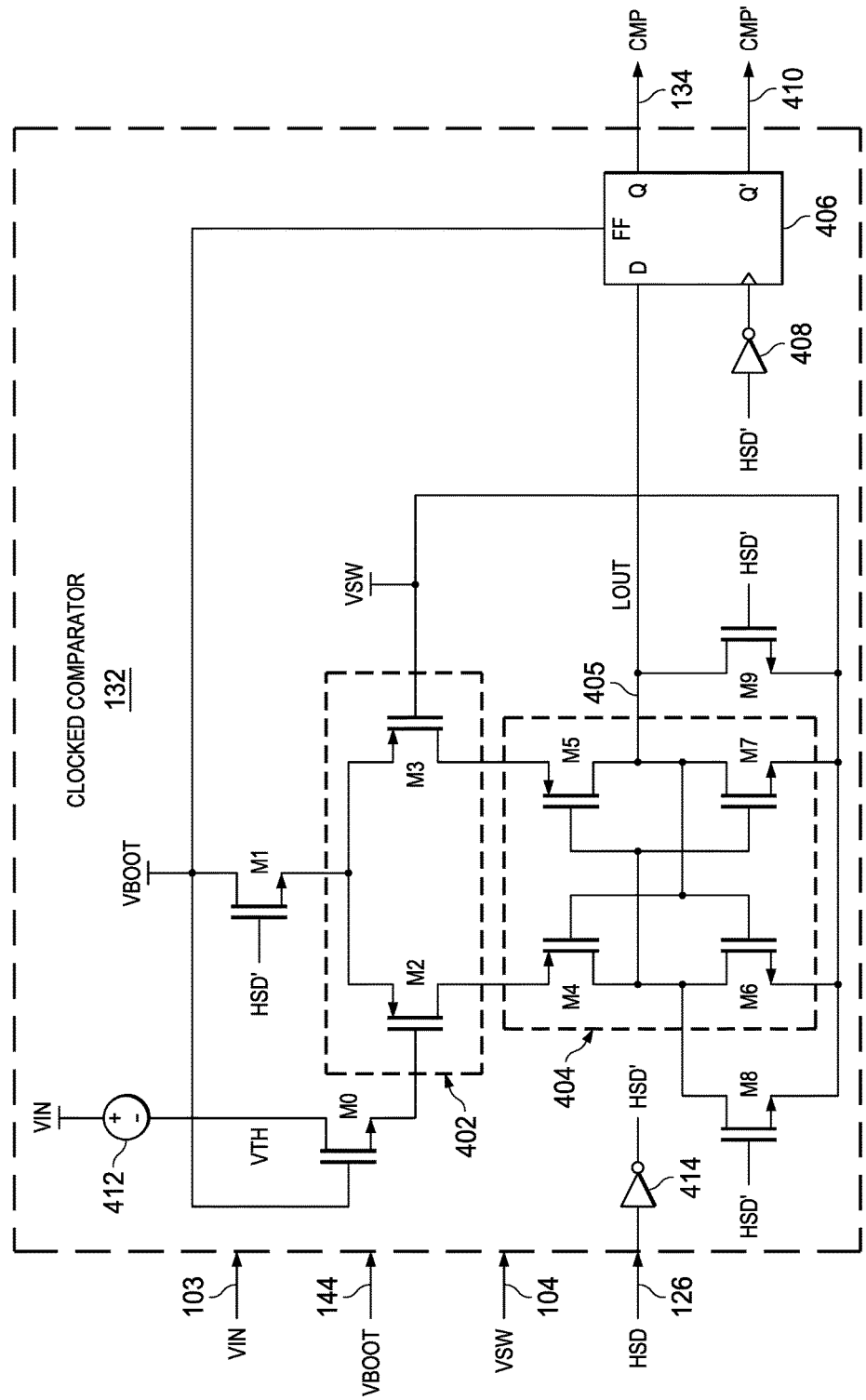
FIG. 4 is a schematic diagram showing further details of an example clocked comparator circuit that can be used in the controller IC of FIG. 1.

FIG. 4 shows further details of an example clocked comparator circuit 132 suitable for use in the controller IC 101 of FIG. 1. In the illustrated example, the clocked comparator circuit 132 includes a clock input connected to the output node 126 of the control circuit 120 and an inverter 414 to receive the first driver signal HSD and to generate an inverter signal HSD'. The circuit 132 further includes a pair of outputs 134 and 410 to provide complementary comparator signals CMP and CMP' that are referenced to voltage VSW of the switching node 104. The clocked comparator circuit 132 includes a differential pair circuit 402 including PMOS transistors M2 and M3. In this example, the clocked comparator circuit 132 performs a sample operation clocked by a falling edge of the HSD' signal. A PMOS transistor M1 connects the sources of M2 and M3 in a differential pair circuit 402 with the second supply voltage VBOOT at the node 144 when the HSD' signal is low.

The differential pair circuit 402 includes a first input coupled through an NMOS transistor M0 with the threshold voltage VTH provided by a voltage supply 412 as a fixed voltage at or below the input voltage VIN at the node 103. M0 is biased on by connection if its gate to VBOOT so that M0 connects the threshold voltage VTH to the gate of M2. M0 can be omitted in certain implementations. Where included, the transistor M0 protects the gate oxide of M2 against high voltages that may be seen at the input node 103 (VIN) or the threshold voltage VTH. The gate of M3 forms a second input of the differential pair formed by M2 and M3.

This input is connected to the switching node 104 to receive the voltage signal VSW. The drain terminals of M2 and M3 are connected to a CMOS latch circuit 404 that includes PMOS transistors M4 and M5 and NMOS transistor is M6 and M7 forming a cross-coupled pair of CMOS inverters M4/M6 and M5/M7. The input of the first CMOS inverter is formed by a latch circuit output node 405 joining the gates of M4 and M6, and is connected to the output of the second CMOS inverter joining the drains of M5 and M7. The input of the second CMOS inverter is connected to the gates of M5 and M7, and this node is connected to the output node of the first CMOS inverter at the drains of M4 and M6. NMOS transistors M8 and M9 are connected between the individual CMOS inverter inputs and the switching node 104 to reset the latch state when HSD' is high (responsive to the rising edge of HSD).

A high HSD' signal level (e.g., at or near VBOOT) resets the latch circuit 404 and turns off M1 to remove power from the differential pair circuit 402. In this state, the latch output voltage signal LOUT at the node 405 is low because M9 is turned on. When the clock signal HSD' goes low, M1 turns on and the reset transistors M8 and M9 are turned off. Connection of the differential pair circuit 402 to the second supply node 144 powers the transistors M2 and M3, and the higher of the two voltages VTH and VSW control the state of the differential signal applied to the latch circuit 404. If VTH>VSW at the falling edge of the HSD' signal, M3 turns on before M2 and the second CMOS inverter M5, M7 forces the latch output node 405 high (e.g., LOUT is at or near VBOOT). Otherwise, if VTH<VSW at the falling edge of the HSD' signal, M2 turns on before M3 and the first CMOS inverter M4, M6 forces the latch output node 405 low (e.g., LOUT is at or near VSW). In this manner, the latch circuit output 405 provides the latch output voltage signal LOUT representing the state of the differential pair circuit 402 in response to the falling edge of the signal HSD'.

The clocked comparator circuit 132 also includes a D flip-flop 406 to provide the complementary output signals CMP and CMP' to the level shift circuit 136 and to save the state of the latch after HSD goes high. In the illustrated example, the CMP signal on the output line 134 represents the state of the LOUT signal established by the latch circuit 404 in response to the falling edge of the HSD' signal. The D input of the flip-flop 406 receives the latch output voltage signal LOUT. The flip-flop 406 includes a clock input connected to receive the compliment of the clock signal HSD' via an inverter 408 to clock the flip-flop 406 after the falling edges of the HSD signal. The Q output of the flip-flop 406 provides the comparator signal CMP clocked by the second (falling) edge of the signal HSD, and the CMP signal is referenced to the switching node 104. In this example, the CMP signal is high when VTH>VSW, and CMP is low when VTH<VSW for the current switching cycle. The clocked comparator circuit 132 draws little power in operation due to the use of low voltage MOS transistors in the circuits 402 and 404, and provides fast response for sensing the voltage across the high-side switch S1 for ZVS control.

Figure 5:
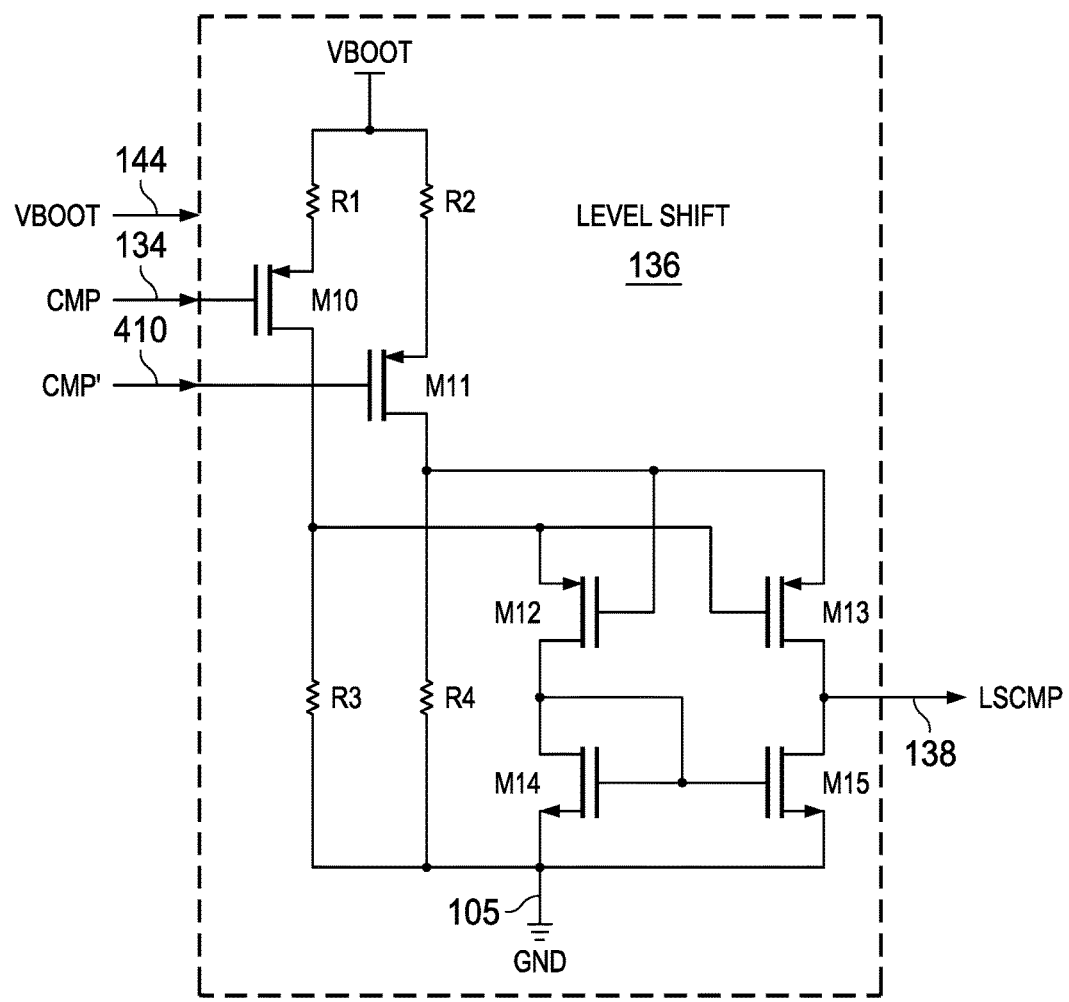
FIG. 5 is a schematic diagram showing an example low-power level shifter circuit that can be used in the controller IC of FIG. 1.

FIG. 5 shows an example low-power level shift circuit 136 that can be used in the controller IC 101 of FIG. 1. The level shift circuit 136 is referenced to the reference voltage node 105 and powered by the second supply voltage node 144. The level shift circuit 136 includes an input connected to the clocked comparator circuit 132 to receive the comparator signal CMP on the line 134 and its complement CMP' on the line 410. The level shift circuit output 138 provides the level shifted comparator signal LSCMP, referenced to the reference voltage node 105. A first PMOS transistor M10 is connected through a first resistor R1 to the second supply voltage VBOOT and a resistor R3. The gate of M10 receives the comparator signal CMP from the clocked comparator circuit output node 134. The complementary comparator output signal CMP' is provided to the gate of a second PMOS transistor M11 connected to the line 410 of the clocked comparator 132. A second resistor R2 connects the source of M11 to the second supply voltage VBOOT, and a fourth resistor R4 connects the drain of M11 to the reference voltage GND at node 105. A PMOS transistor M12 and an NMOS transistor M14 are connected in series with one another between the drain of M10 and the reference voltage node 105, and the gate of M12 is connected to the drain of M11. A PMOS transistor M13 and an NMOS transistor M15 are connected in series between the drain of M11 and the reference voltage node 105, and the drains of M13 and M15 are connected to the output node 138 to provide the signal LSCMP. The gates of M14 and M15 are connected together and to the drain of M14 to form a current mirror circuit.

When CMP is high and CMP' is low (VTH>VSW), M11 turns on and the resistive divider circuit R2/R4 provides a voltage signal at the source of M13, while M10 is off and the voltage applied to the gate of M13 is near the reference voltage GND. This turns on M13, and the level shifted comparator output signal LSCMP, like the CMP signal, is high. When CMP is low and CMP' is high (VTH<VSW), M10 turns on and the resistive divider circuit R1/R3 provides a voltage signal at the source of M12, while M11 is off and the voltage applied to the gate of M12 is low. This turns M12 on and the level shifted comparator output signal LSCMP is low. Thus the output signal LSCMP is provided at a Boolean logic level corresponding to the state of the CMP signal. The resistive divider networks R1/R3 and R2/R4 provide a level shift ratio, and the output stage M13 and M15 provide the level shifted comparator output signal LSCMP referenced to the reference voltage GND.

Figure 6:
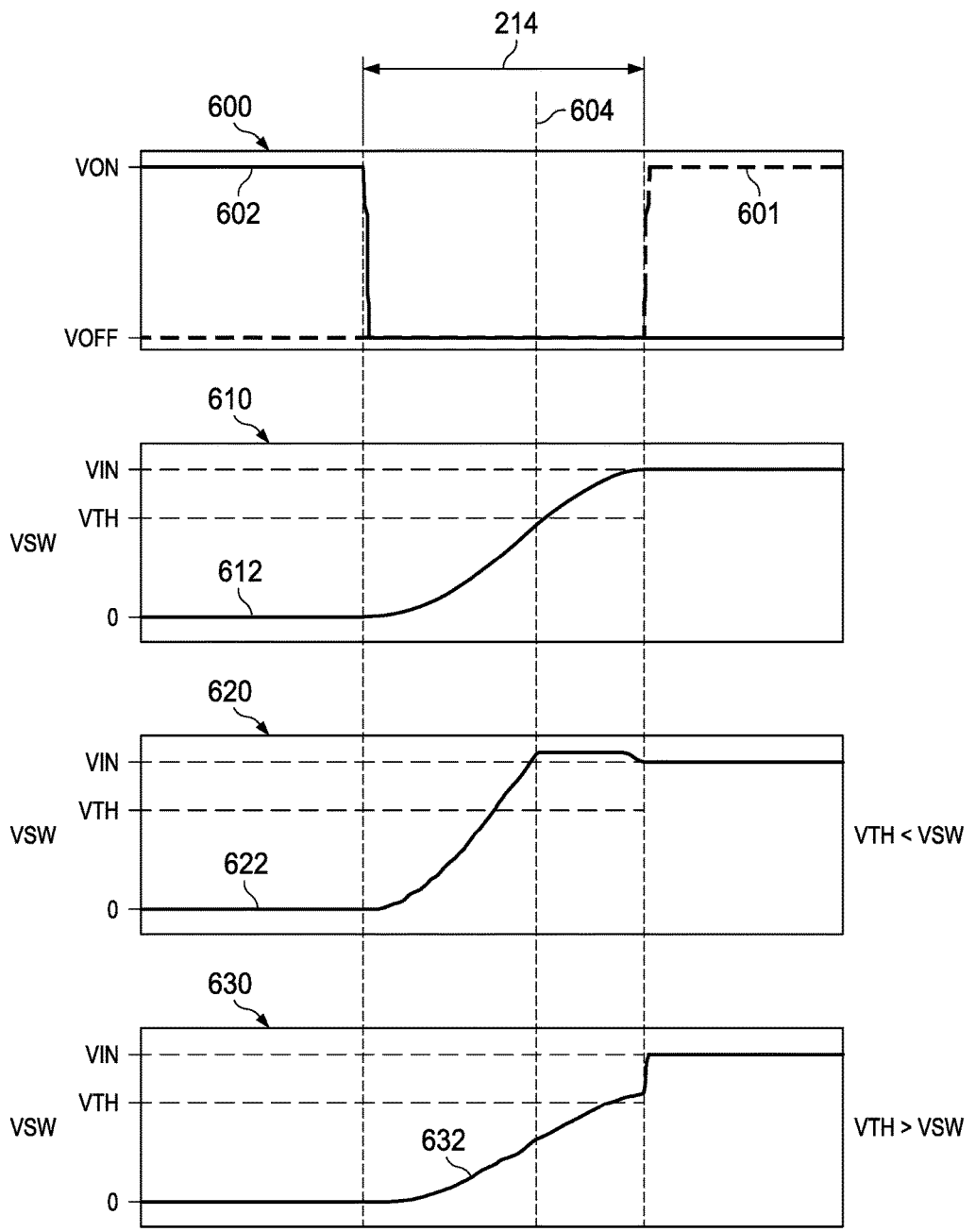
FIG. 6 is a waveform diagram showing high and low-side switching control signals as well as corresponding switching voltage curves using a clocked comparator in FIG. 1 to sample the voltages across the high-side switch during a dead time between turn off of the low-side switch and turn on of the high-side switch.

FIG. 6 shows a graph 600 illustrating example high and low-side switching control signals 601 (SC1) and 602 (SC2) as a function of time where S2 turns off and then S1 turns on after a dead time delay 214. FIG. 6 also shows graphs 610, 620 and 630 that illustrate corresponding switching voltage curves 612, 622 and 632 during the dead time 214 between S2 turning off and S1 turning on. The clocked comparator 132 of FIG. 1 samples the voltages VTH and VSW associated with the high-side switch S1 during the dead time 214 in response to the falling edge of the HSD signal. In FIG. 6, the time 604 indicates the point at which the zero voltage switching circuit 124 assesses the state of the LSCMP signal at the input 125. The graph 610 illustrates an ideal dead time utilization in which the switching node voltage curve 612 VSW transitions between 0 and a final voltage (e.g., at approximately VIN) smoothly with no overshoot, and the switching node voltage VSW is approximately equal to the threshold voltage VTH at the time 604 when the clock comparator circuit samples the voltages VTH and VSW.

In operation, one example of the zero voltage switching circuit 124 operates in closed loop fashion according to the comparator signal LSCMP to regulate the voltage across S1 to be at or near 0 V when S1 is turned on. The graph 620 illustrates an example situation in which the dead time 214 is excessive, causing the switching node voltage curve 622 to be above the input voltage (VIN<VSW) when the high-side switch S1 is turned on. In this case, the control circuit 120 selectively decreases the delay time 214 (FIG. 2 above) in the next switching control cycle of the DC-DC converter 100. The graph 630 shows another situation where the input voltage is greater than the switching node voltage when S1 is turned on (VIN>VSW). In this case, the control circuit 120 selectively increases the delay time 214 in the given control cycle based on the comparator signal LSCMP in the preceding control cycle. In this manner, the clocked comparator output signal CMP or LSCMP is used to adapt the power converter in next switching cycle to be close to ZVS. The one cycle latency in this control approach removes the need for fast level shifters and allows the use of the bootstrapped second supply voltage VBOOT to bias supply of the high-side driver circuitry 112, 114. Powering the comparator circuit 130 from the second supply voltage VBOOT and referencing the comparator circuit 130 to the switching node 104 improves the response time of the comparator and reduces cost and circuit complexity over other approaches using voltage dividers and high voltage cascode devices. These disclosed examples provide an extremely fast, low-power clocked comparator approach that can be built with low-voltage components and resolve millivolt differences on a high-voltage, high slew-rate signal. In addition, the clocked comparator approach of disclosed examples reduces the power consumption while still maintaining a low propagation delay to facilitate zero voltage switching of the high-side device S1. The disclosed circuits and techniques can be used in a variety of different applications, including without limitation high-efficiency power converters where nanosecond timing is important and any additional supply current reduces total system efficiency.

Figure 7:
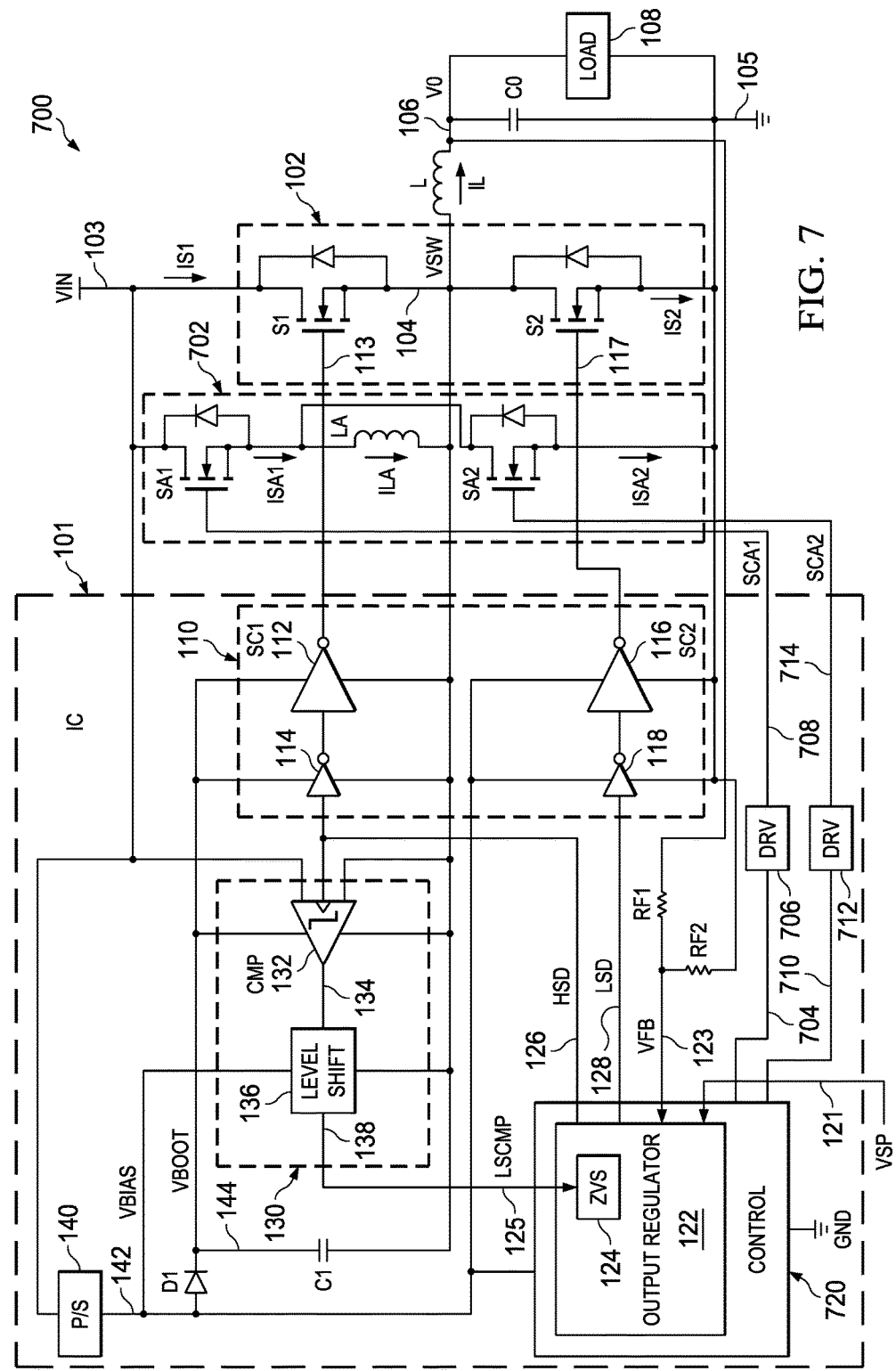
FIG. 7 is a schematic diagram showing another DC-DC buck converter with a controller integrated circuit (IC) including first and second auxiliary switches and an auxiliary inductor and a clocked comparator referenced to a switch node voltage to measure a voltage across a high-side switching device and a low power level shifter circuit to provide a level shifted comparator signal to a control circuit to implement zero voltage switching.
Figure 8:
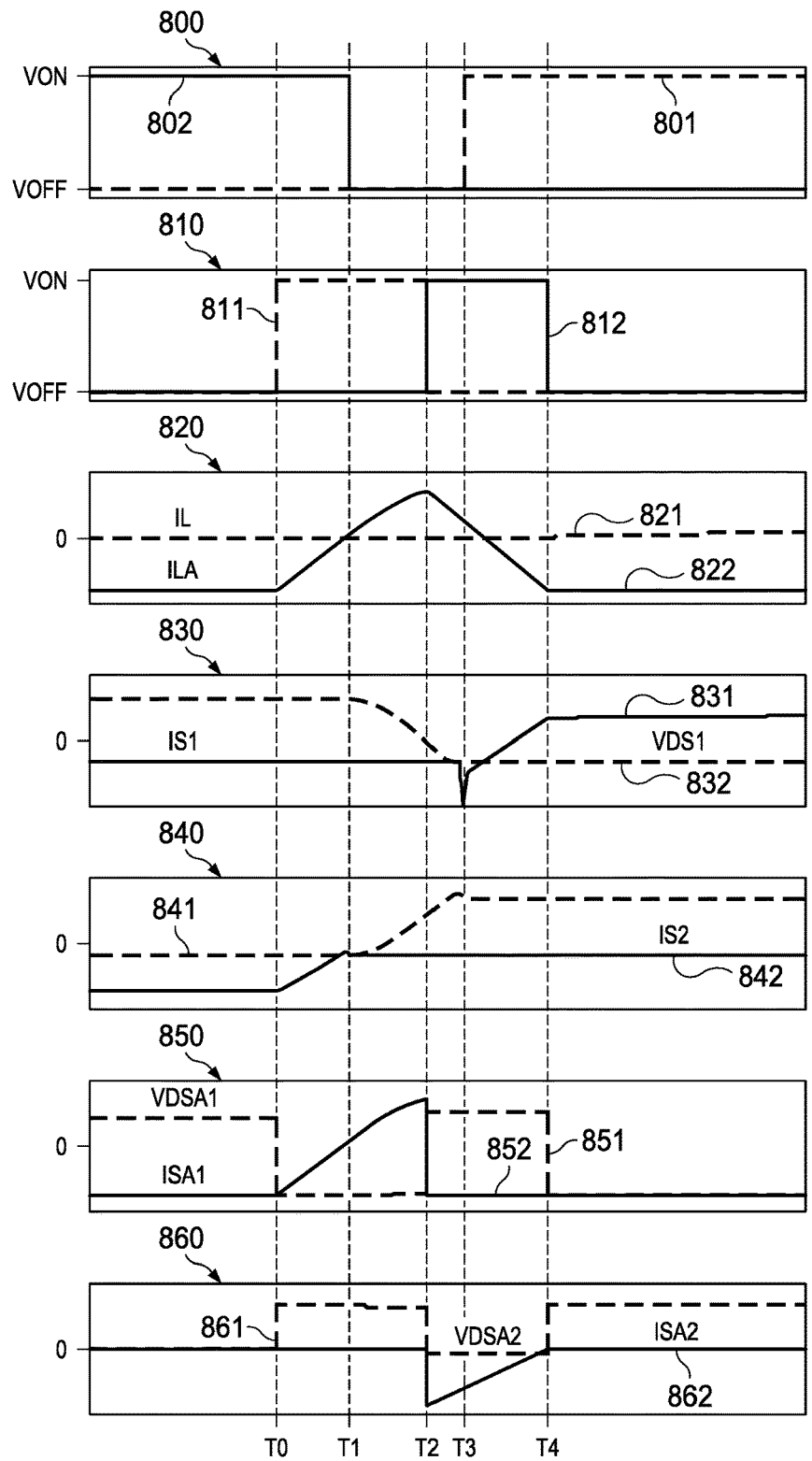
FIG. 8 is a waveform diagram showing switching control signals along with voltage and current signal curves during switching operation in the DC-DC converter of FIG. 7.

Another embodiment is illustrated in FIGS. 7 and 8, in which a buck type DC-DC converter circuit 700 includes an IC 101 with a floating clocked comparator/level shifter circuit 130 as generally described above. In addition, the DC-DC converter circuit 700 includes an auxiliary switching circuit 702 with first and second auxiliary switches SA1 and SA2, and an auxiliary inductor LA connected with the switch circuit 102 to further facilitate near zero voltage switching of the high-side switch S1. In FIG. 7, the main and auxiliary switches are enhancement mode n-channel MOSFETs, although other types and forms of switches can be used. In addition, body diodes of the illustrated switches S1, S2, SA1 and SA2 are illustrated in FIG. 7. The first auxiliary switch SA1 has a drain terminal connected to the input voltage node 103 and a source terminal connected to an upper terminal of the auxiliary inductor LA and to the drain terminal of the second auxiliary switch SA2. A second terminal of the auxiliary inductor LA is connected to the switching node 104. The source terminal of the second auxiliary switch SA2 is connected to the reference voltage node 105. The IC in this example includes a control circuit 720 that provides the high and low side driver signals on the nodes 126 and 128 as described above. In addition, the control circuit 720 in FIG. 7 includes output nodes 704 and 710 to provide auxiliary control signals to operate the auxiliary switches SA1 and SA2, respectively. A first auxiliary driver circuit 706 receives a first auxiliary control signal from the node 704 and provides a first auxiliary switching control signal SCA1 at an output 708 connected to the gate control terminal of the first auxiliary switch SA1. A second auxiliary driver circuit 712 receives a second auxiliary control signal from the node 710. The second driver circuit 712 has an output node 714 that provides a second auxiliary switching control signal SCA2 to the gate control terminal of the second auxiliary switch SA2.

FIG. 8 provides graphs 800, 810, 820, 830, 840, 850 and 860 illustrating various signal waveforms and control signals in the DC-DC converter circuit 700 of FIG. 7. The graph 800 includes a curve 801 showing the first switching control signal SC1 and a curve 802 showing the second switching control signal SC2 (active high) to operate the first and second buck converter switches S1 and S2, respectively. The graph 810 includes a curve 811 illustrating the first auxiliary switching control signal SCA1, and a curve 812 showing the second auxiliary switching control signal SCA2. The circuit operates with first and second primary switching states. In a first switching state, S1 is on or close and S2 is off or open. In the second primary switching state, S2 is on and S1 is off. The zero voltage switching control advantageously drives the switching during transition from the second primary switching state to the first primary switching state such that the voltage across S1 is at or near zero when S1 is turned on as in the example described above in connection with FIG. 1.

The graph 820 in FIG. 8 includes a curve 821 showing the main inductor current IL, and a curve 822 shows the auxiliary inductor current ILA flowing through the auxiliary inductor LA in FIG. 7. Graph 830 shows a curve 831 illustrating the drain-source voltage across S1, as well as a curve 832 representing the current IS1 flowing through the high-side switch S1. Graph 840 shows a curve 841 representing the switch node voltage VSW (i.e., the voltage across the low-side switch S2), and a curve 842 illustrating the current IS2 flowing through the low-side switch S2. The graph 850 includes a first curve 851 illustrating the voltage VDSA1 across the first auxiliary switch SA1 as well as a curve 852 showing the current ISA1 flowing through the first auxiliary switch SAL The graph 860 provides a curve 861 illustrating the voltage VDSA2 across the second auxiliary switch SA2 and a curve 862 showing the current ISA2 flowing through the second auxiliary switch SA2.

The waveforms and signals are illustrated in FIG. 8 as a function of time during the transition from S2 turning off and S1 turning on to transfer energy from the main inductor L to the output load 108 in FIG. 7. Prior to time T0 in FIG. 8, S2 has been turned on, and switches S1, SA1 and SA2 have been off for a significant portion of the DC-DC converter switching cycle. At time T0, SA1 is turned on by the control circuit 720 (curve 811 transitions from the VOFF level to the VON level), and the current ILA shown in curve 822 of the graph 820 ramps up to the level of the output inductor current IL at time T1. At T1, the control circuit 720 turns S2 off (curve 802 transitions from the VON level to the VOFF level). From T1 to T2, the auxiliary inductor current ILA continues to increase (curve 822), and the auxiliary inductor LA resonates with the switch node capacitance associated with the low-side switch S2 and the high-side switch S1. This resonance increases the switch node voltage VSW (VDS2), shown as an increase in the curve 841.

At time T2, the control circuit 720 turns the first auxiliary switch SA1 off, and the switch node voltage (curve 841) continues to resonate up to the input voltage level VIN between T2 and time T3. The control circuit 720 also turns the switch SA2 off at T2, causing a negative current ISA2 to flow through SA2 as shown in the curve. Between T2 and T3, the negative ISA2 ramps toward zero, and the auxiliary inductor current ILA begins to decrease back toward the output inductor current level IL.

At time T3, the control circuit 720 turns the high-side switch S1 on. The control circuit 720 controls the timing between T1 and T3, directly or indirectly, to preferably turn on the switch S1 at T3 at or near the point at which the voltage across S1 (curve 831 VDS1) reaches or crosses zero. This can be indirectly controlled in one example by the control circuit 720 directly controlling the time between T0 and T1. As previously discussed, the floating switch comparator and level shifting circuitry 130 advantageously provides the comparator signals CMP and LSCMP for use by the ZVS circuit 124 of the output regulator 122 in order to cause the control circuit 720 to adjust the time T3 in FIG. 8 for a subsequent DC-DC converter switching control cycle based on the polarity of the measured voltage between the threshold voltage VTH and the switch node voltage VSW in the current converter switching cycle (e.g., whether the voltage VSW is above or below the threshold level VTH. As seen in the curve 862 in FIG. 8, the auxiliary switch current ISA2 continues to ramp toward zero between T3 and T4, and the high-side switch current IS1 ramps up from T3 to T4 while the auxiliary inductor current ILA continues to drop toward zero. Once the auxiliary current ILA (curve 822) reaches zero, the control circuit 720 turns off the second auxiliary switch SA2 (e.g., curve 812 returns to the VOFF level). As described in the embodiments above, the inverted high-side switching signal HSD' is used to clock the comparator circuit 132 and the control circuit 720 receives the level shifted comparator circuit LSCMP from the level shift circuit 136. Based on the state of the LSCMP signal, the control circuit 720 selectively adjusts the delay time (e.g., between T1 and T3 in FIG. 8, time 214 in FIG. 6 above, or between T0 and T1) between S2 turning off and S1 turning on. In the example of FIG. 7, the operation of the auxiliary switches SA1 and SA2 and the auxiliary inductor LA mitigates or eliminates a large portion of the switching loss of the DC-DC converter 700 by soft switching the main switching node 104. In addition, the controlled adjustment of the delay time between T1 and T3 (e.g., or between T0 and T1) via the circuitry 130 facilitates zero voltage switching or near-zero voltage switching for turning on S1.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:

1. A DC-DC converter circuit to control an output voltage signal, the DC-DC converter circuit comprising:
   a first switching device coupled between an input voltage node and a switching node, the first switching device operative according to a first switching control signal;
   a second switching device coupled between the switching node and a reference voltage node, the second switching device operative according to a second switching control signal;
   a first supply voltage node to provide a first supply voltage relative to a reference voltage of the reference voltage node;
   a second supply voltage node, connected to the first supply voltage node through a diode, to provide a second supply voltage relative to the switching node;
   a first driver circuit, referenced to the switching node and powered by the second supply voltage, to provide the first switching control signal according to a first driver signal;
   a second driver circuit, powered by the first supply voltage, to provide the second switching control signal according to a second driver signal;
   a control circuit, referenced to the reference voltage node and powered by the first supply voltage, to provide the first and second driver signals to regulate an output voltage signal according to a feedback signal, and to adjust a delay time between the second switching device turning off and the first switching device turning on according to a level shifted comparator signal; and
   a comparator circuit, referenced to the switching node and powered by the second supply voltage, to sample a switching node voltage of the switching node in response to a first edge of the first driver signal, and to generate a comparator signal having: a first state indicating that a threshold voltage is less than the switching node voltage; and a second state indicating that the threshold voltage is greater than the switching node voltage; the comparator circuit including: a clocked comparator circuit, including a clock input connected to the control circuit to receive the first driver signal, and an output to provide the comparator signal referenced to the switching node; and a level shift circuit, including an input connected to the clocked comparator circuit to receive the comparator signal, and an output to provide the level shifted comparator signal referenced to the reference voltage node.

2. The DC-DC converter circuit of claim 1, wherein the clocked comparator circuit includes:
   a differential pair circuit, including a first input coupled to receive the threshold voltage, and a second input coupled with the switching node;
   a first transistor to selectively couple the differential pair circuit with the second supply voltage node in response to the first edge of the first driver signal; and
   a CMOS latch circuit coupled to the differential pair circuit, the CMOS latch circuit including an output to provide a latch output voltage signal representing a state of the differential pair circuit in response to the first edge of the first driver signal.

3. The DC-DC converter circuit of claim 2, wherein the clocked comparator circuit further includes a flip-flop, including an input to receive the latch output voltage signal, and an output to provide the comparator signal clocked by a second edge of the first driver signal and referenced to the switching node.

4. The DC-DC converter circuit of claim 2, wherein the level shift circuit is referenced to the reference voltage node and powered by the second supply voltage node.

5. The DC-DC converter circuit of claim 1, wherein the control circuit is arranged to decrease the delay time in a given control cycle in response to the comparator signal in a preceding control cycle indicating the first state, and to increase the delay time in the given control cycle in response to the comparator signal in the preceding control cycle indicating the second state.

6. The DC-DC converter circuit of claim 1, wherein the control circuit is arranged to selectively decrease the delay time in a given control cycle in response to the comparator signal in a preceding control cycle indicating the first state, and to selectively increase the delay time in the given control cycle in response to the comparator signal in the preceding control cycle indicating the second state.

7. The DC-DC converter circuit of claim 1, wherein the control circuit and the comparator circuit are fabricated in a single integrated circuit.

8. The DC-DC converter circuit of claim 7, wherein the first driver circuit and the second driver circuit are fabricated in the integrated circuit.

9. The DC-DC converter circuit of claim 8, wherein the first switching device and the second switching device are fabricated in the integrated circuit.

10. The DC-DC converter circuit of claim 8, further comprising an inductor connected between the switching node and a load to form a buck converter to control the output voltage signal at the load.

11. A DC-DC controller to operate first and second switching devices coupled between an input voltage node and a reference voltage node to control an output voltage signal of a DC-DC converter, the DC-DC controller comprising:
a first supply voltage node to provide a first supply voltage relative to a reference voltage of the reference voltage node;
a diode, including an anode connected to the first supply voltage node, and a cathode connected to a second supply voltage node to provide a second supply voltage relative to a switching node of the DC-DC converter;
a control circuit, referenced to the reference voltage node and powered by the first supply voltage, to provide first and second driver signals to respectively operate the first and second switching devices to control the output voltage signal, and to adjust a delay time between the second switching device turning off and the first switching device turning on according to a level shifted comparator signal; and
a comparator circuit, referenced to the switching node and powered by the second supply voltage, to sample a switching node voltage of the switching node connected to the first switching device in response to a first edge of the first driver signal, and to generate a comparator signal having: a first state indicating that a threshold voltage is less than the switching node voltage; and a second state indicating that the threshold voltage is greater than the switching node voltage;
the comparator circuit including: a clocked comparator circuit, including a clock input connected to the control circuit to receive the first driver signal, and an output to provide the comparator signal referenced to the switching node; and a level shift circuit, including an input to receive the comparator signal, and an output to provide the level shifted comparator signal referenced to the reference voltage node.

12. The DC-DC controller of claim 11, wherein the clocked comparator circuit includes:
a differential pair circuit, including a first input coupled to receive the threshold voltage, and a second input coupled with the switching node;
a first transistor to selectively couple the differential pair circuit with the second supply voltage node in response to the first edge of the first driver signal; and
a CMOS latch circuit coupled to the differential pair circuit, the CMOS latch circuit including an output to provide a latch output voltage signal representing a state of the differential pair circuit in response to the first edge of the first driver signal.

13. The DC-DC controller of claim 12, further comprising a flip-flop, including an input to receive the latch output voltage signal, and an output to provide the comparator signal clocked by a second edge of the first driver signal and referenced to the switching node.

14. The DC-DC controller of claim 12, wherein the level shift circuit is referenced to the reference voltage node and powered by the second supply voltage node.

15. The DC-DC controller of claim 11, wherein the control circuit is arranged to decrease the delay time in a given control cycle in response to the comparator signal in a preceding control cycle indicating the first state, and to increase the delay time in the given control cycle in response to the comparator signal in the preceding control cycle indicating the second state.

16. The DC-DC controller of claim 11, wherein the control circuit is arranged to decrease the delay time in a given control cycle in response to the comparator signal in a preceding control cycle indicating the first state, and to increase the delay time in the given control cycle in response to the comparator signal in the preceding control cycle indicating the second state.

17. An integrated circuit (IC), comprising:
a power supply to provide a first supply voltage at a first supply voltage node relative to a reference voltage of a reference voltage node;
a diode, including an anode connected to the first supply voltage node, and a cathode connected to a second supply voltage node to provide a second supply voltage relative to a switching node of a DC-DC converter;
a control circuit, referenced to the reference voltage node and powered by the first supply voltage, to provide first and second driver signals to respectively operate high-side and low-side switching devices to control an output voltage signal of the DC-DC converter, and to adjust a delay time between the low-side switching device turning off and the high-side switching device turning on according to a level shifted comparator signal; and
a comparator circuit, referenced to the switching node and powered by the second supply voltage, to sample a switching node voltage of the switching node in response to a first edge of the first driver signal, and to generate a comparator signal having: a first state indicating that a threshold voltage is less than the switching node voltage; and a second state indicating that the threshold voltage is greater than the switching node voltage;
the comparator circuit including: a clocked comparator circuit, including a clock input connected to the control circuit to receive the first driver signal, and an output to provide the comparator signal referenced to the switching node; and a level shift circuit, including an input to receive the comparator signal, and an output to provide the level shifted comparator signal referenced to the reference voltage node.

18. The IC of claim 17, further comprising:
a first driver circuit referenced to the switching node and powered by the second supply voltage, to provide a first switching control signal to operate the high-side switching device according to the first driver signal; and
a second driver circuit, referenced to the reference voltage node and powered by the first supply voltage, to provide a second switching control signal to operate the low-side switching device according to the second driver signal.

19. The IC of claim 18, wherein the high-side switching device and the low-side switching device are fabricated in the IC.

20. The IC of claim 17, wherein the clocked comparator circuit includes:
a differential pair circuit, including a first input coupled to receive the threshold voltage, and a second input coupled with the switching node;
a first transistor to selectively couple the differential pair circuit with the second supply voltage node in response to the first edge of the first driver signal; and a CMOS latch circuit coupled to the differential pair circuit, the CMOS latch circuit including an output to provide a latch output voltage signal representing a state of the differential pair circuit in response to the first edge of the first driver signal.

21. The IC of claim 17, wherein the level shift circuit is referenced to the reference voltage node and powered by the second supply voltage node.

22. The IC of claim 17, wherein the control circuit is arranged to decrease the delay time in a given control cycle in response to the comparator signal in a preceding control cycle indicating the first state, and to increase the delay time in the given control cycle in response to the comparator signal in the preceding control cycle indicating the second state.

23. The IC of claim 17, wherein the control circuit is arranged to decrease the delay time in a given control cycle in response to the comparator signal in a preceding control cycle indicating the first state, and to increase the delay time in the given control cycle in response to the comparator signal in the preceding control cycle indicating the second state.

* * * * *